(12) United States Patent
Pan et al.

(10) Patent No.: US 7,768,430 B1
(45) Date of Patent: Aug. 3, 2010

(54) LOOK-UP TABLE BASED MEMORY

(75) Inventors: Philip Pan, Fremont, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/124,091

(22) Filed: May 20, 2008

(51) Int. Cl.
  *H03M 7/00* (2006.01)
(52) U.S. Cl. .......................... 341/106; 326/38; 326/40; 326/41
(58) Field of Classification Search ................. 341/106, 341/50, 51; 326/38, 40, 41
  See application file for complete search history.

(56) References Cited

U.S. PATENT DOCUMENTS

| | | | |
|---|---|---|---|
| 5,977,791 A * | 11/1999 | Veenstra | 326/40 |
| 6,249,143 B1 * | 6/2001 | Zaveri et al. | 326/40 |
| 6,340,897 B1 * | 1/2002 | Lytle et al. | 326/40 |
| 6,356,110 B1 * | 3/2002 | Reddy et al. | 326/41 |
| 6,462,577 B1 * | 10/2002 | Lee et al. | 326/40 |
| 7,084,665 B1 * | 8/2006 | Lewis et al. | 326/38 |
| 2007/0146178 A1 * | 6/2007 | Lewis et al. | 341/106 |

* cited by examiner

*Primary Examiner*—Jean B Jeanglaude
(74) *Attorney, Agent, or Firm*—Martine Penilla & Gencarella, LLP

(57) ABSTRACT

An integrated circuit (IC) having selectable memory elements is provided. The IC includes a logic array block (LAB) disposed within the IC. A plurality of logic elements, having look-up tables functioning as the selectable memory elements is included in the LAB. Within a logic element, a data path that shares multiplexers and drivers when the look-up tables of the logic elements are operated as one of a memory element or a combinational logic device is provided. In addition, a write address decoder is interconnected with the plurality of logic elements through a write bus.

24 Claims, 9 Drawing Sheets

LOOK-UP TABLE BASED MEMORY

BACKGROUND

The present invention relates to the field of integrated circuits and in particular, to providing a flexible dual port memory within an integrated circuit. Programmable integrated circuits, such as programmable logic devices (PLD), are becoming more complex and continually evolving to provide more usable programmable features in a single integrated circuit. Modern programmable logic devices incorporate programmable logic including logic gates, and look-up tables, as well as embedded user programmable memory or configuration random access memory (CRAM).

Despite the success of programmable logic, there is a continuing desire to provide greater functionality in a programmable logic device, and at the same time, to provide greater flexibility. There is also a need to provide higher performance user memories also. Currently, the memories for a programmable logic device are typically pre-defined in size and these pre-defined memories are used under restrictions. Thus, the restrictions limit the flexibility of using the memories, e.g., when a portion of the programmable logic device that contains the memory or combinational logic that includes memory is unused, the memory remains unused.

Accordingly, there is a need for a highly flexible memory, which may be selectively configured between combinational logic functions and memory functions within a programmable logic device.

SUMMARY

Embodiments of the present invention provide a method and a framework for configuring the memories within a programmable logic device to meet customer demands for greater flexibility. The ratio of memory to logic may also be adjusted through the embodiments described herein so as to enhance the flexibility of the device. It should be appreciated that the present invention can be implemented in numerous ways, such as a process, an apparatus, a system, a device or a method on a computer readable medium. Several inventive embodiments of the present invention are described below.

In one aspect of the invention, a programmable logic device (PLD) having selectable memory elements is provided. The PLD includes a logic array block (LAB) disposed within the PLD. A plurality of logic elements, having look-up tables functioning as the selectable memory elements is included in the LAB. Within a logic element, a data path that shares multiplexers and drivers when the look-up tables of the logic elements are operated as either a memory element or a combinational logic device is provided. In addition, a write address decoder is interconnected with the plurality of logic elements through a write bus. Thus, a user is able to configure a look-up table that may be used to take advantage of the memory capabilities through the embodiments described herein.

In another aspect, a method for selectively configuring a look-up table for a programmable logic device (PLD) is provided. The method includes defining a write address decoder within a logic array block of the PLD and interconnecting each logic element of the logic array block through a write bus providing column select and row select signals from the write address decoder. The look up table can be operated as either combinational logic device or a memory element based on values of select signals generated by a configuration of the PLD.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Embodiments of the present invention provide a method and a framework for configuring the memories within a programmable logic device to meet customer demands for greater flexibility. The ratio of memory to logic may also be adjusted through the embodiments described herein so as to enhance the flexibility of the device. It will be obvious, however, to one skilled in the art, that the present invention may be practiced without some or all of these specific details. In other instances, well known process operations have not been described in detail in order not to unnecessarily obscure the present invention.

The embodiments described herein provide for an innovative addressing decoding scheme for a look up table (LUT) based memory within a PLD. It should be appreciated that the LUT based memory uses multiple logic elements to form a discrete memory capable of having varying sizes depending on the number of logic elements utilized. In one embodiment, eight or ten logic elements are included in each logic array block (LAB). It should be noted that the number of logic elements is exemplary and not meant to be restrictive as any suitable number of logic elements may be included within a LAB depending on the specific architecture. The embodiments provide for utilizing the LUT based memory within a LAB through an address decoding scheme that requires no extra interconnects on top of an existing LAB within the PLD. The embodiments provide a write port address decoder, while utilizing multiplexers and drivers for the data path of the LUT function for the read address decoders. In one embodiment, the write address decoder is modularly built and distributed to each logic element of the LAB to gain layout efficiency and allow the output signals to be shared by memory arrays of different logic elements. In addition, the embodiments described herein balance the utilization ratio between logic devices and memory.

Figure 1:
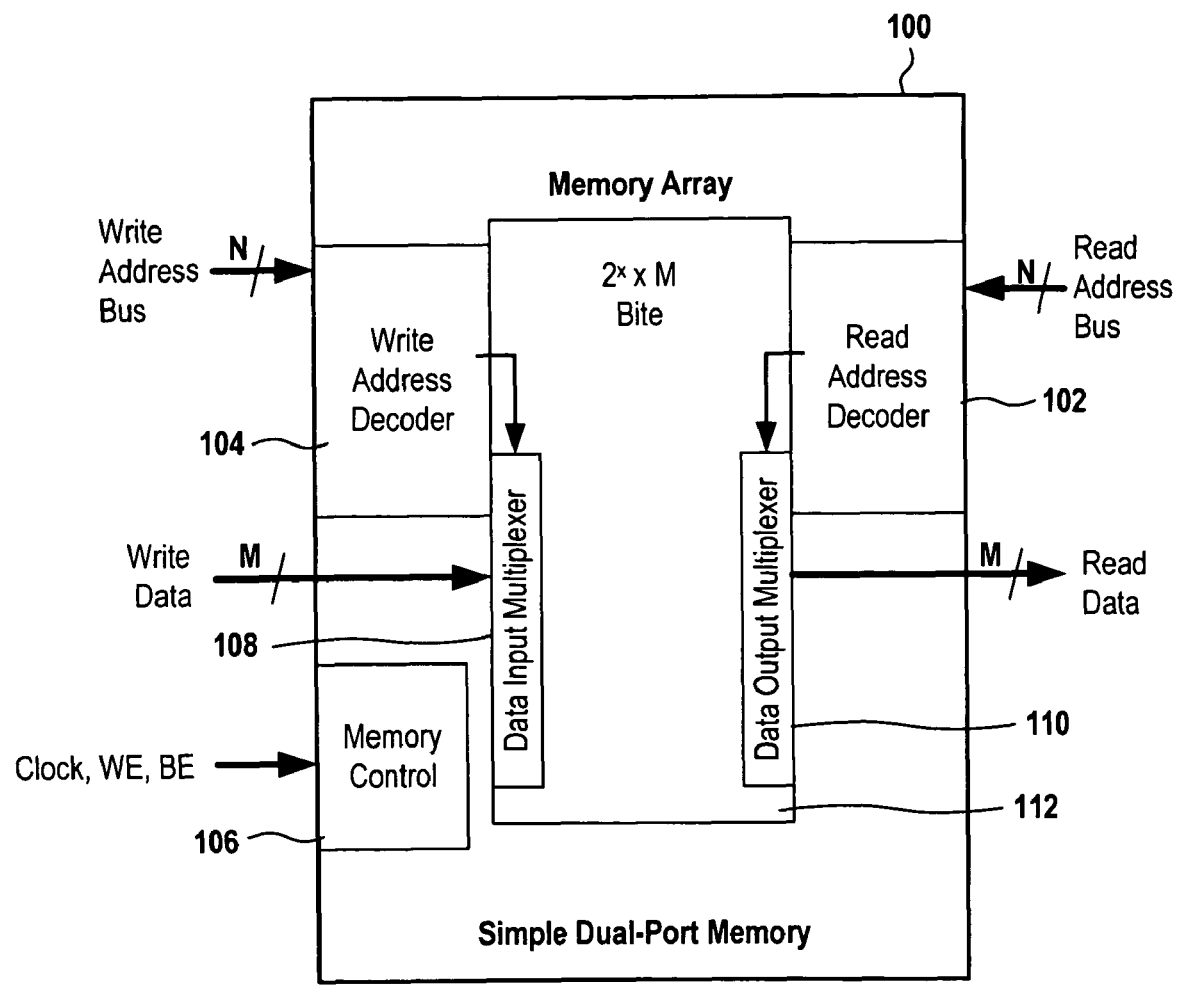
FIG. 1 is a simplified schematic diagram of a simple dual port memory.

FIG. 1 is a simplified schematic diagram of a simple dual port memory. Memory 100 includes read address decoder 102 and write address decoder 104. The two centralized decoder blocks allow for read and write operations to occur at different memory locations simultaneously. Memory control 106 controls the clock signal, write enable (WE) signal, byte enable (BE) signal, etc. Memory array 112 is a $2^N \times M$ bit array. Write data comes into data input multiplexer 108 and read data is output on data output multiplexer 110. One skilled in the art will appreciate that read address bus inputs data into read address decoder which then selects data through data output multiplexer 110. Similarly, write address bus provides data which is decoded through write address decoder 104 in order to specify where to store write data through data input multiplexer 108.

Figure 2:
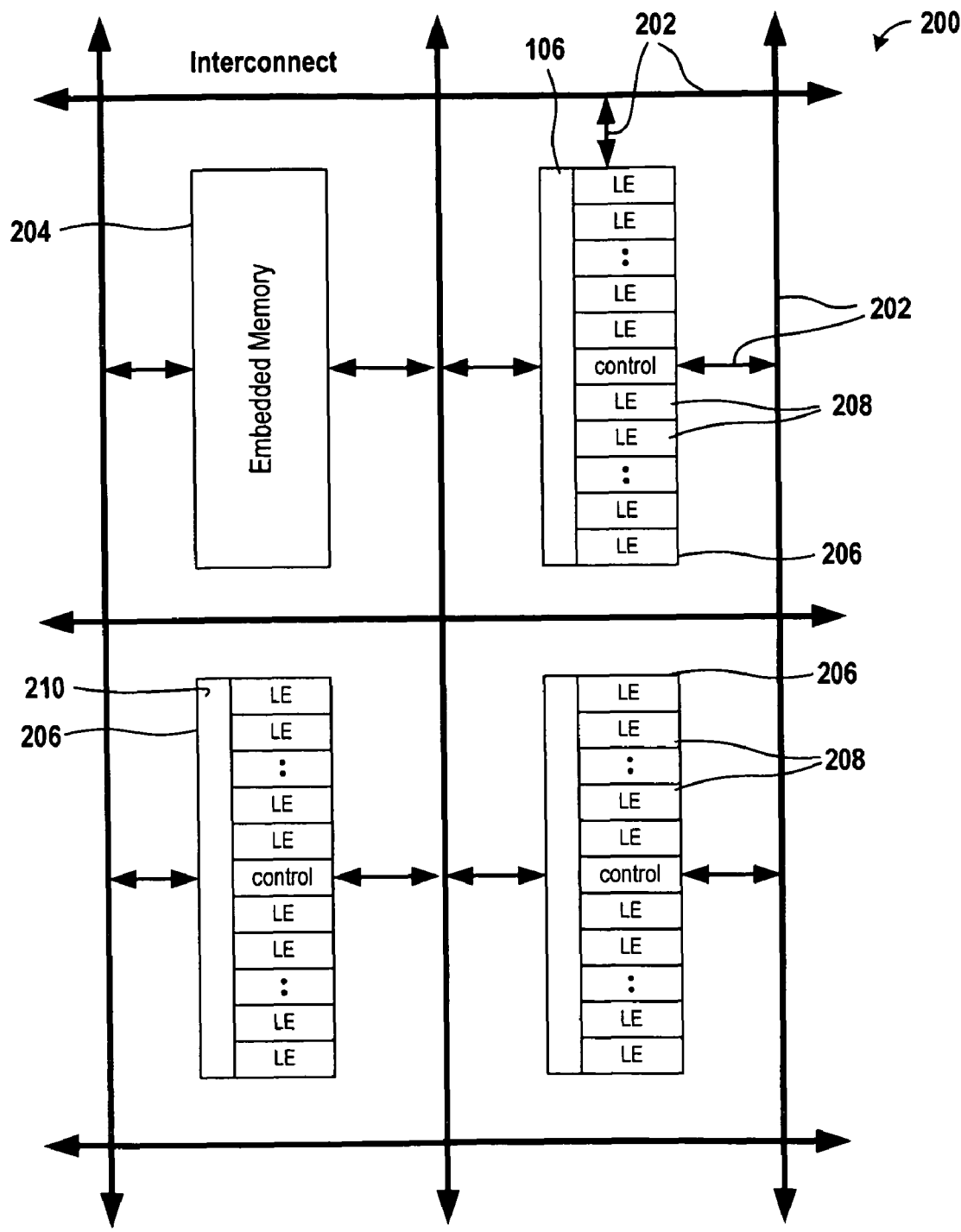
FIG. 2 is a simplified schematic diagram of an interconnect layout for logic blocks of a programmable logic device with an embedded memory in accordance with one embodiment of the invention.

FIG. 2 is a simplified schematic diagram of an interconnect layout for logic blocks of a programmable logic device with an embedded memory in accordance with one embodiment of the invention. Programmable logic device 200 includes routing circuitry 202 which distributes signals through the different blocks within the programmable logic device. Embedded memory 204 is distributed throughout the programmable logic device as well as logic array blocks 206. It should be appreciated that some of the logic blocks may not be utilized depending on the customer's application. The embodiments described herein enable conversion of some of logic blocks 206 to be utilized as memory as described in further detail below. As a high level description, logic array blocks 206 include a plurality of logic elements 208. The logic elements communicate with each other through internal interconnect structure 210. The logic element's look up tables (LUT) contain logic gates and perform some functionality depending on the configuration for the PLD. As illustrated with regard to FIG. 2, the input and output signals of embedded memory 204, e.g., address, data, control, are generated from routing circuitry 202, i.e., the global PLD interconnect. It should be appreciated that these signals are created separately from the input/output connections for the logic elements in the logic array blocks (LAB) 206. That is, the LUT based memory block is physically created inside a LAB and shares the input and the output signals with the LAB. The embodiments described below provide for a LUT based memory with no extra costs of interconnects on top of a LAB, as all signals that support the configurable memory need no additional routing from the interconnect structure. Further details on the architecture of logic array blocks may be found in U.S. Pat. No. 5,260,610, which is incorporated herein by reference for all purposes.

Figure 3:
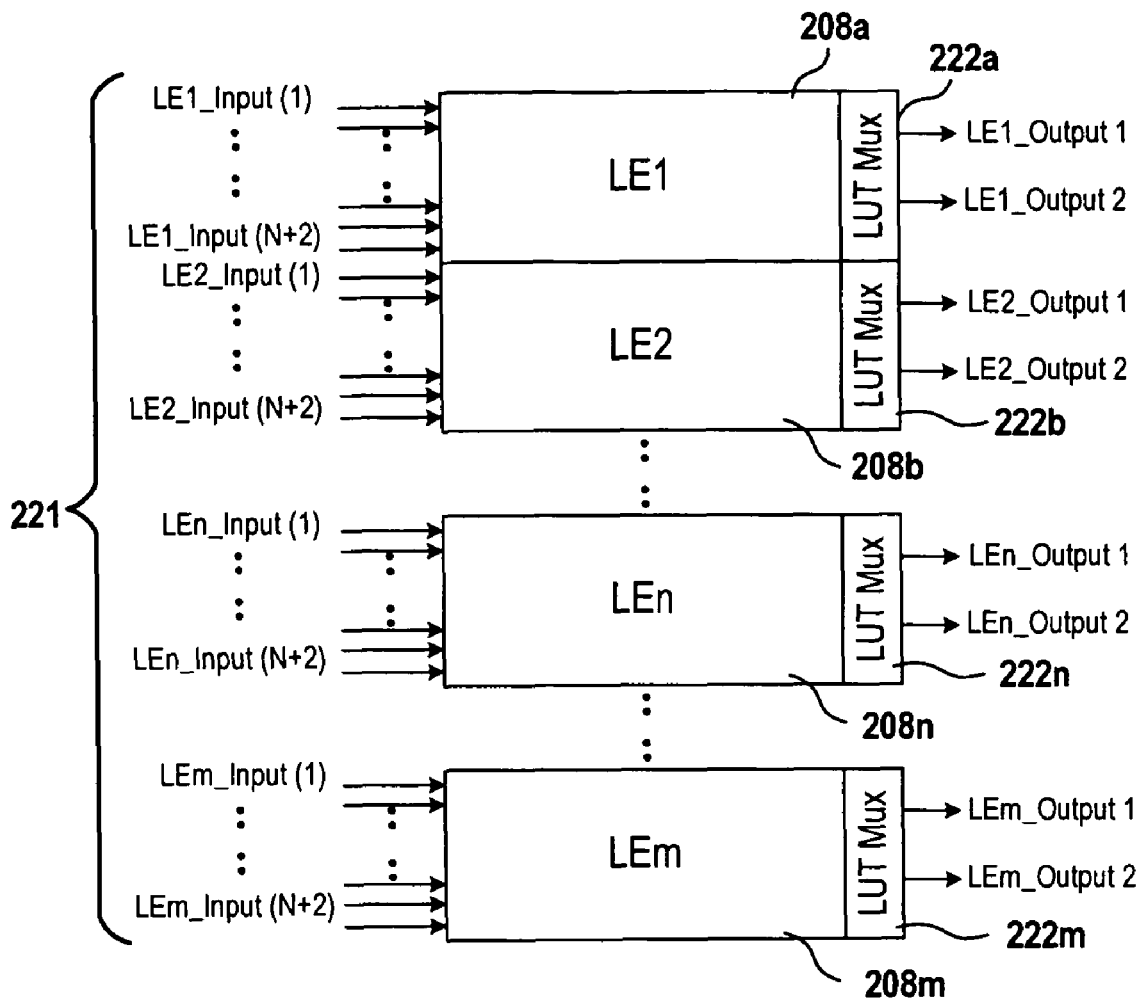
FIG. 3 is a simplified schematic diagram illustrating the functional aspects of look-up table control signals on a logic array block in accordance with one embodiment of the invention.

FIG. 3 is a simplified schematic diagram illustrating the functional aspects of a look-up table control signals on a logic array block in accordance with one embodiment of the invention. Logic elements 208a through 208m are included within the logic array block. Each logic element 208a through 208m provides two outputs through corresponding look-up table multiplexers 222a through 222m. Inputs 221 for each logic element 208a through 208m are provided and may be multiplexed into the logic elements through a logic element input multiplexer in one embodiment. In one embodiment, there are two extra inputs which are utilized through the embodiments described herein in order to convert the logic elements to a memory storage bit such as a static random access memory (SRAM).

Figure 4:
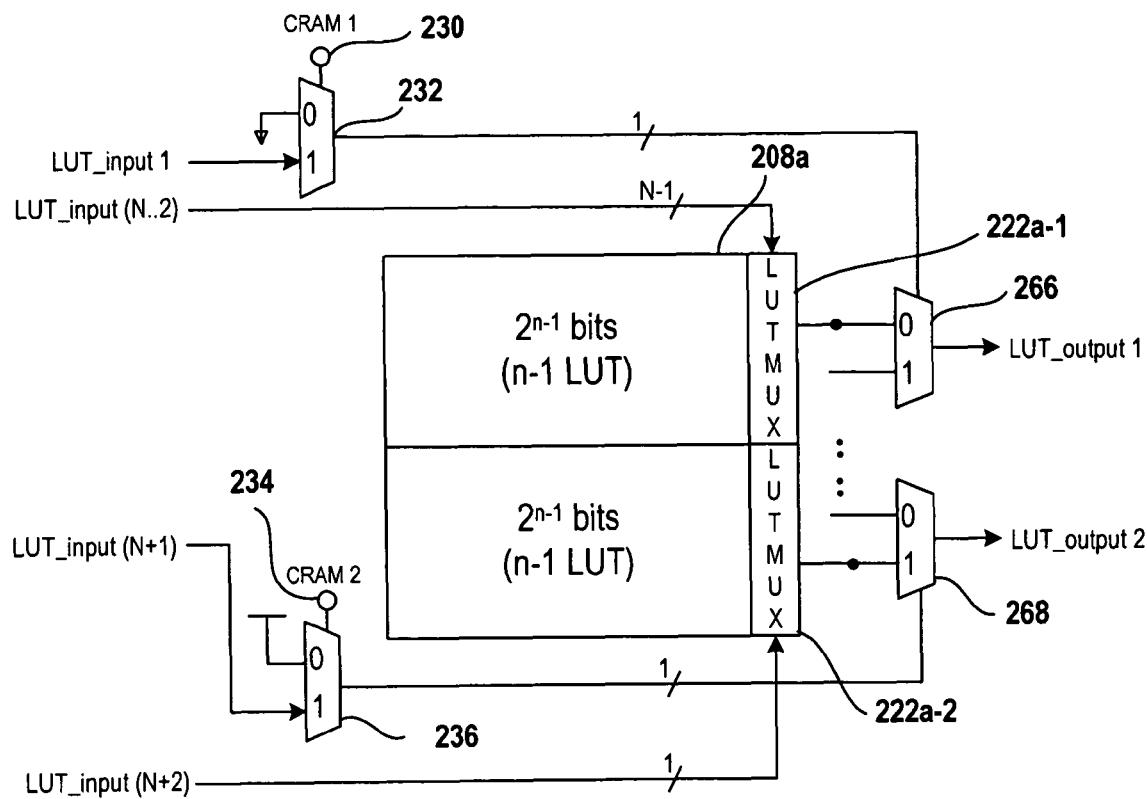
FIG. 4 is a simplified schematic diagram illustrating the functional aspects of the look-up table control signals on a logic element in accordance with one embodiment of the invention.

FIG. 4 is a simplified schematic diagram illustrating the functional aspects of the look-up table control signals on a logic element in accordance with one embodiment of the invention. In FIG. 4, logic element 208a is illustrated as including two look-up tables having corresponding look-up table multiplexers 222a-1 and 222a-2. Configuration random access memory (CRAM) bits 230 and 234 are used to select outputs from corresponding look-up tables. For example, CRAM 230 provides a select signal for multiplexer 232, which triggers an output that is subsequently used by multiplexer 266 to select an output from the lookup tables of logic element 208a. Similarly, CRAM 234 provides a select signal for multiplexer 236, which outputs a signal used to select the output from multiplexer 268. For the case of N=6, it should be appreciated that where each LUT of logic element 208a has two sets of 32 addresses, then for a single bit data width configuration as described with reference to FIGS. 5 and 6, there are 6 bits or pins for the read address, one pin for a data input, and a last pin can be used for a write enable signal (also referred to as a write address). Furthermore, for a two bit data width configuration as described with reference to FIGS. 7 and 8, there are 5 pins for the read addresses, two for data input and a last pin for a write enable. As described in more detail below, the number of pins or signals for the single bit or double bit embodiments remains the same and the current layout of the logic elements provides sufficient pins for these embodiments. Thus, the embodiments take advantage of the current architecture with minimal additions. It should be appreciated that eight pins are available for a logic array block having eight logic elements, however, where 10 logic elements are integrated into a logic array block, ten pins are available. Thus, with ten logic elements there would still be two extra pins available.

Figure 5:
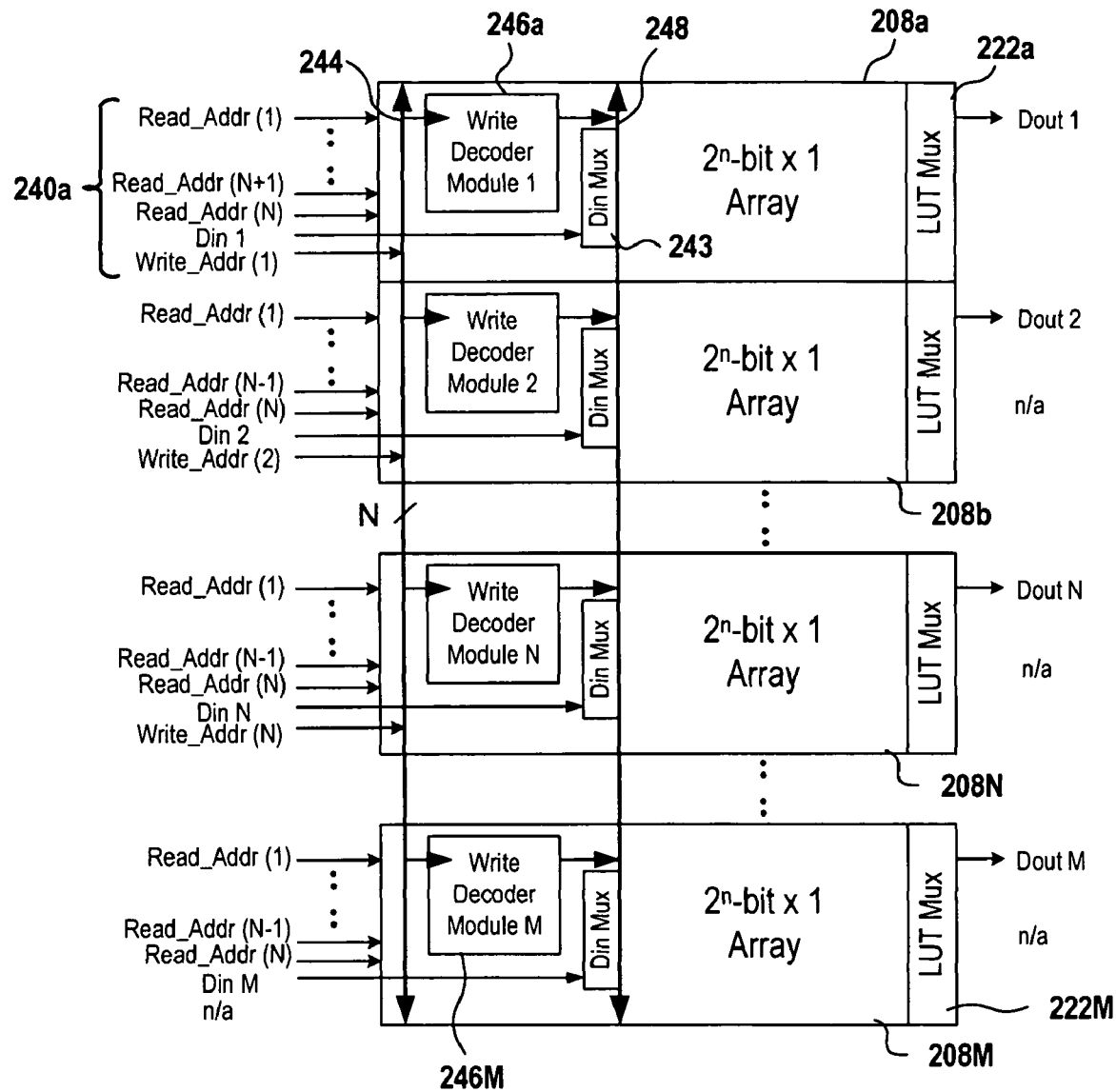
FIG. 5 is a simplified schematic diagram of a lookup table based memory with a single bit data width configuration per logical element in accordance with one embodiment of the invention.
Figure 6:
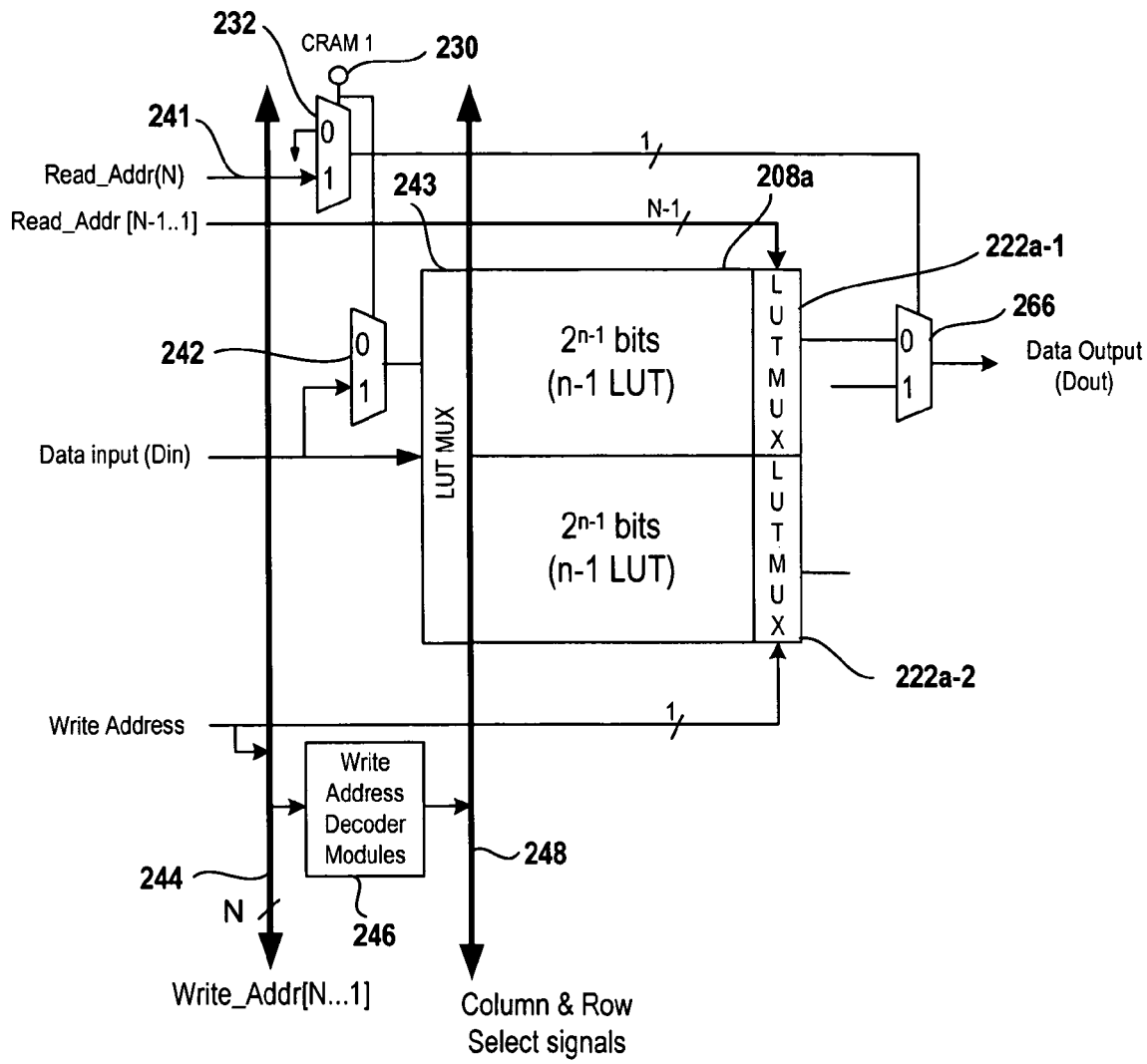
FIG. 6 is a functional diagram of a lookup table based memory with a single bit data width configuration in accordance with one embodiment of the invention.

FIG. 5 is a simplified schematic diagram of a lookup table based memory with a single bit data width configuration per logical element in accordance with one embodiment of the invention. It should be appreciated that the input signals for FIGS. 5 and 6 are similar to FIGS. 3 and 4 but are re-defined for memory purposes and use of the array of the logic element as a memory element. In FIGS. 5 and 6, one output is required since the memory is being defined for a single bit data width per logic element. Thus, every logic element block is responsible for taking in one write address until the maximum number is met in one embodiment. As illustrated in the embodiments of FIGS. 5 and 6, each logic element block has a write address decoder module 246a-246M, which generates a portion of column select or row select signals to control data input paths into the logic elements. In FIG. 5, logic elements 208a through 208m include lookup table multiplexer 202a through 202M, which provide a single bit of data out from each respective logic element. The input signals 240a provided for logic element 208a include read address signals 1-N, a data input signal, and a write address signal. The data input signal is provided to data in multiplexers 242 and 243 of FIG. 6, while the write address signal proceeds along write address line 244 to write address decoder module 246. It should be appreciated that address line 244 is an N bit wide address line in one embodiment. Returning to FIG. 5, write address decoder module 246a-M will output a signal to column and row select line 248. In turn, this signal will control where data is written into respective arrays 208a-208M. It should be appreciated that in one embodiment, due to the distribution of the write address along column and row select line 248, the order of the write addresses may be reassigned to allow a slowest write address signal to take the shortest delay path, e.g., shortest distance, to a corresponding write address decoder. One skilled in the art will appreciate that these reassignments can occur during the design phase in one embodiment. It should be noted that this embodiment improves the speed of the device when the logic element is utilized as a memory element.

In FIG. 6, a functional diagram of a lookup table based memory with a single bit data width configuration is further provided with additional details in accordance with one embodiment of the invention. Logic element 208a includes two lookup tables of $2^{n-1}$ bits. As illustrated in FIG. 6, write address decoder module 246 is provided in order to decode where to write data into the array of logic element 208a. Read address (N) signal 241 is provided as one input to multiplexer 232, which has a second input tied to ground. A configuration random access memory (CRAM) bit provides a select signal to multiplexer 232, and the output of multiplexer 232 is a select signal for multiplexer 266, which selects the data coming out from one of the two lookup tables of logic element 208a. Data (Din) is provided into data input multiplexer 242 as well as Din multiplexer block 243. The write address is provided to N bit wide write address line 244, as well as write address decoder module 246, which decodes the address and then provides a signal to column and row select line 248 (which may be referred to as a write bus in one embodiment). It should be noted that in one embodiment M>N. In FIGS. 5 and 6, the addition of the write address decoder and the existing circuitry, i.e., multiplexer 232, for read decoding circuitry enables the logic element to be selectively used as a memory element. It should be noted that during typical combinational logic functions for the programmable logic device, the read decoding circuitry functions as LUT input circuitry for the look-up tables of the logic element. That is, the read address decoder is shared between the two functions depending on whether the configuration dictate that the logic element is used as a memory element or combinational logic device. With the addition of the write address decoder and the CRAM settings, the logic elements of the PLD are capable of functioning as either a memory element or a combinational logic device.

Figure 7:
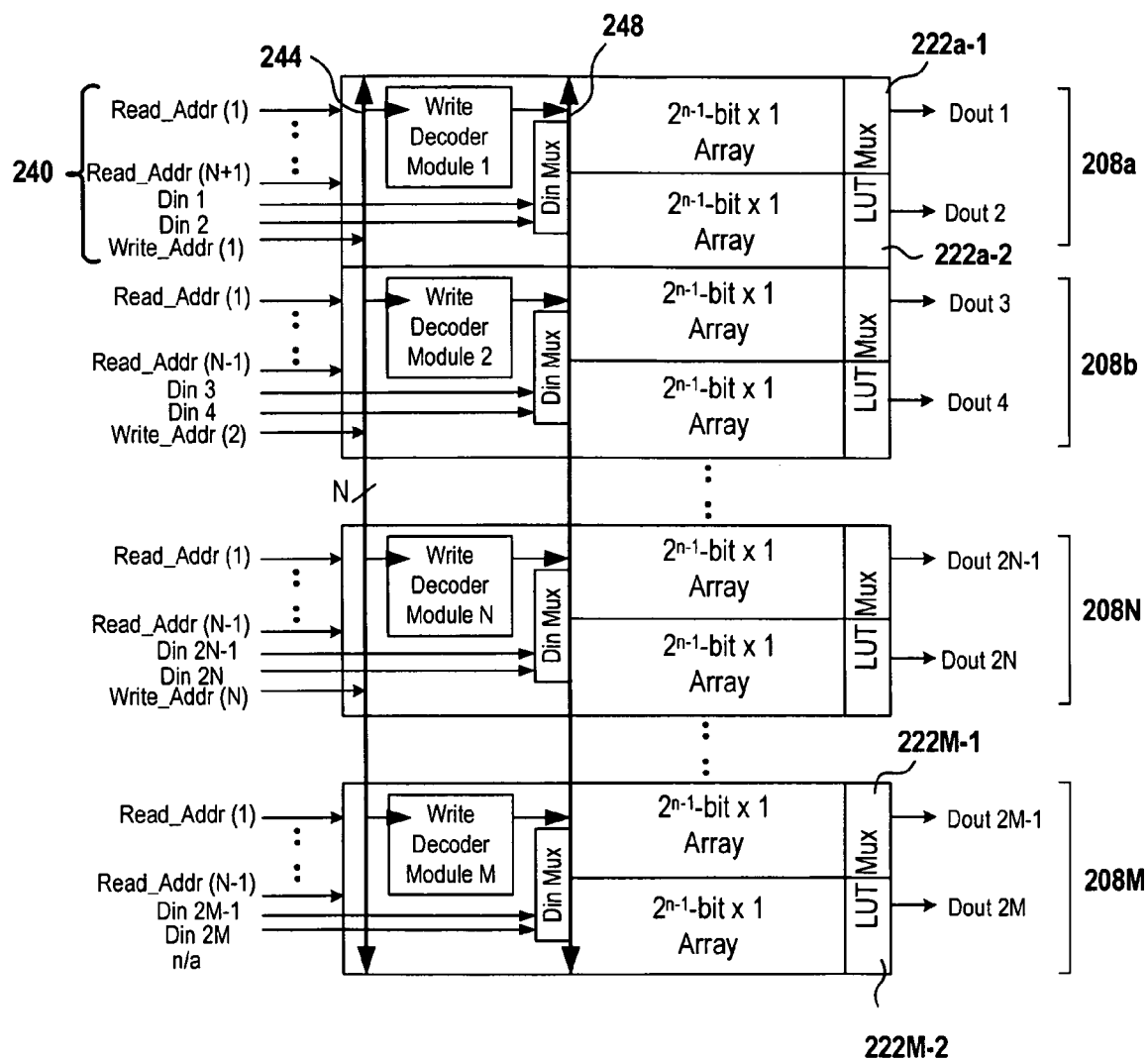
FIG. 7 is a simplified schematic diagram providing the signals to the logic element for a double bit data width configuration in accordance with one embodiment of the invention.
Figure 8:
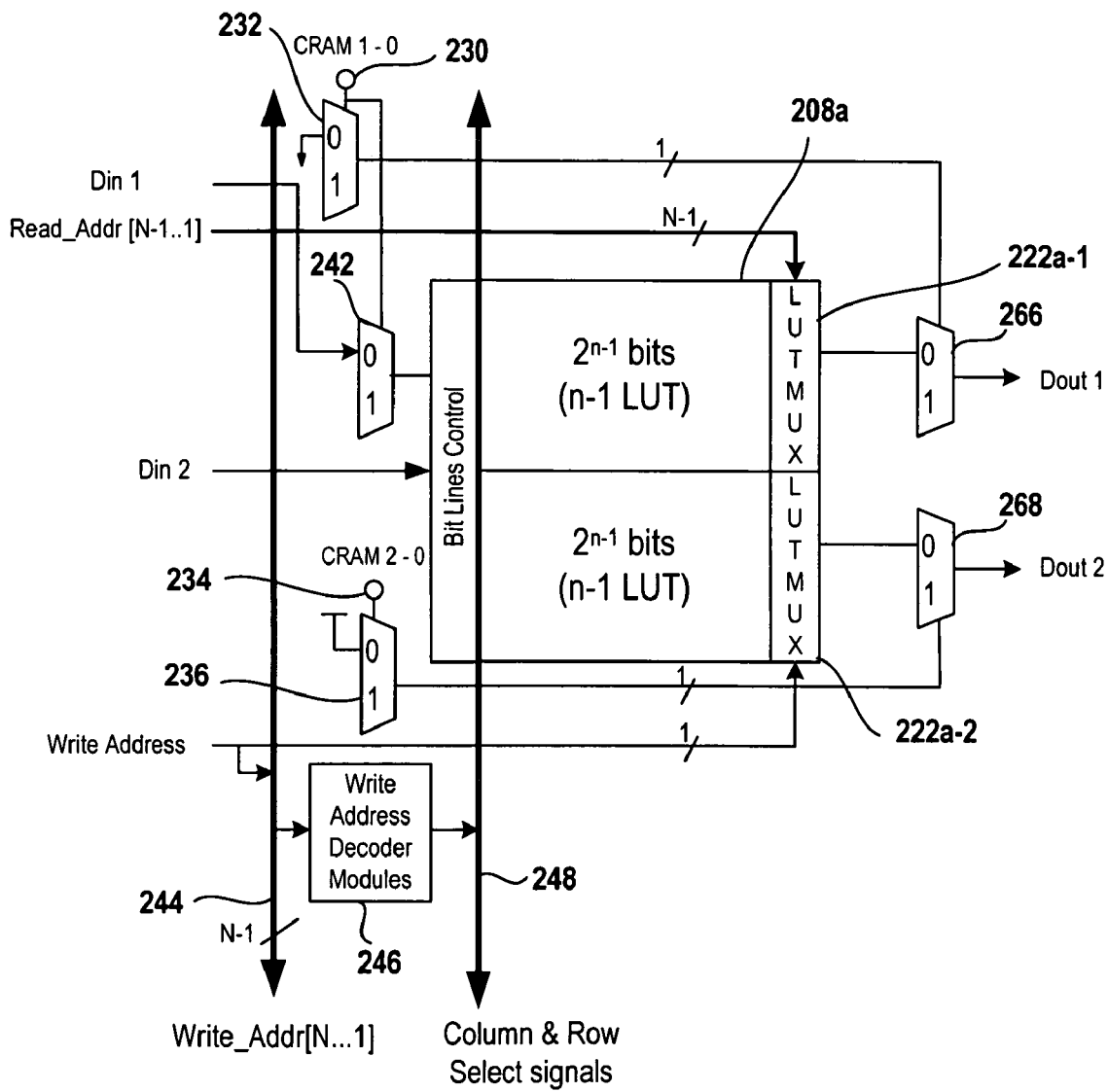
FIG. 8 is a functional diagram of a selectable lookup table based memory with a double bit data width configuration in accordance with one embodiment of the invention.

FIGS. 7 and 8 illustrate functional diagrams of a logic element and a logic array block which has a lookup table based memory with two bit data width per logic element in accordance with one embodiment of the invention. It should be appreciated that FIGS. 5 and 6 provide an embodiment illustrating a single bit data width output per logical element. To achieve the two bit data width, further adjustments to the CRAM settings are made, as well as defining input signals differently as illustrated in FIGS. 7 and 8. FIG. 7 is a simplified schematic diagram illustrating the signals provided to the logic element. The number of read address signals 240 total one less than the number of read address provided for FIG. 5, as a total of 32 addresses with two bit wide data are read simultaneously rather than 64 addresses for one bit wide data in the case of N=6. However, an additional data in line (Din2) is used in order to provide the two bit data width in the embodiment of FIGS. 7 and 8.

It should be appreciated that in FIG. 8 multiplexer 236 is included and provides the select signal for multiplexer 268 to select one of the data bits coming out of the logic element 208a through look up table multiplexers 222a-1 and 222a-2. Likewise, multiplexer 232 provides output used as a select signal for multiplexer 266 to output another one of the data bits from logic element 208a. As illustrated, Data in (Din) 1 is input to multiplexer 242. Multiplexer 242 receives a select signal from CRAM bit 230, as described above with regard to FIG. 6. Din 2 is provided to the bit line control module, which is in communication with the column and row select signal line 248. It should be noted that while an extra Din line is used for the embodiment of FIGS. 7 and 8, one less read address line is used as compared to the embodiment of FIGS. 5 and 6.

Figure 9:
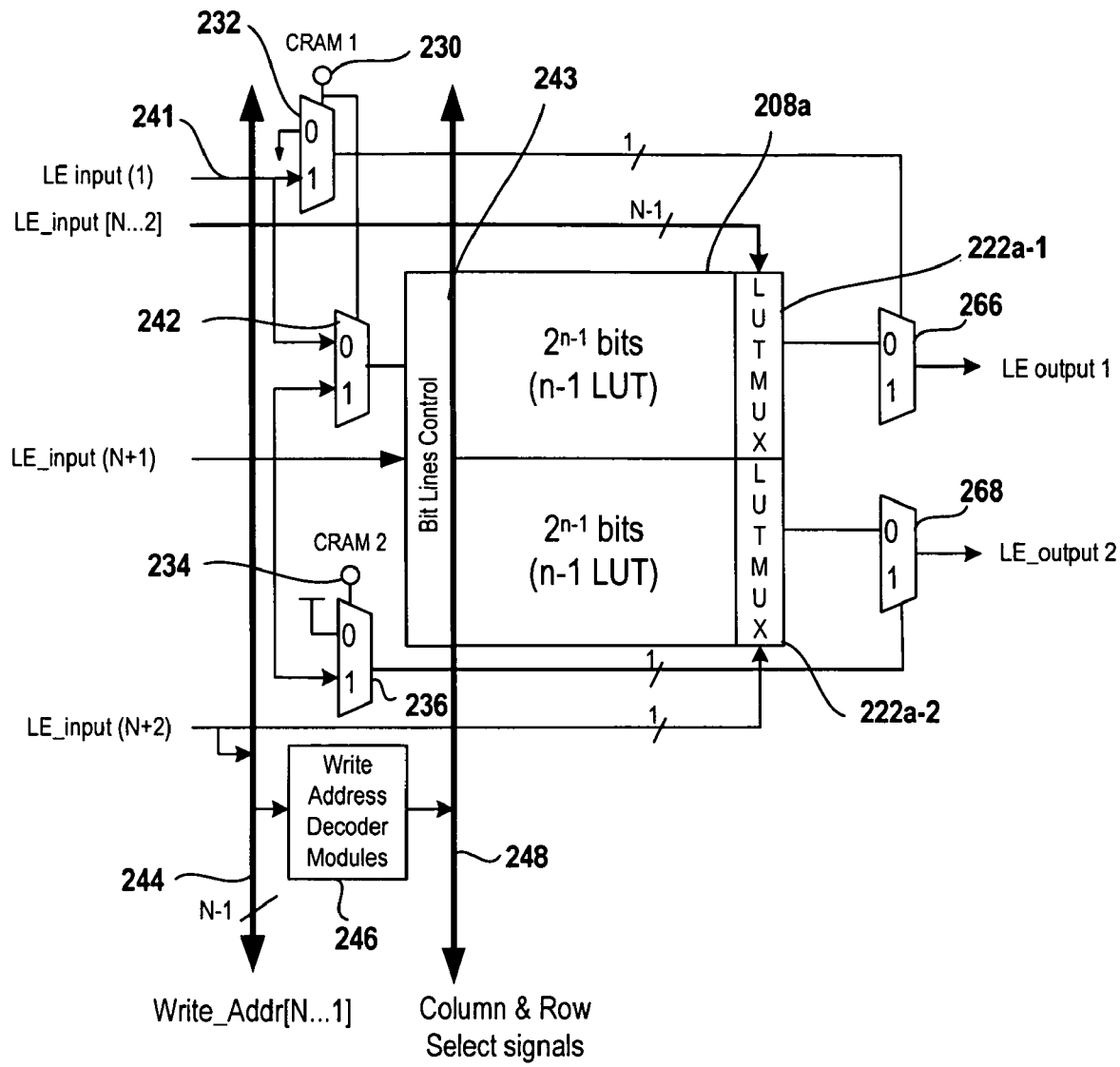
FIG. 9 is a generic functional diagram of a logic element that supports utilization of the logic element as a memory element or a combinational logic element as described herein in accordance with one embodiment of the invention.

FIG. 9 is a generic functional diagram of a logic element that supports all of the above functions described herein in accordance with one embodiment of the invention. In FIG. 9, logic element 208a and corresponding lookup table multiplexers 232, 242, and 236 provide output to multiplexers 266 and 268. Depending on the values of configuration random access memory bits 230 and 234, the output of certain multiplexers may be disabled in order to accommodate the one or two bit memory schemes or to enable the logic element not to function as a memory element and remain a combinational logic block. FIG. 9 represents the complete wiring and circuitry illustrated for the embodiments identified in FIGS. 4, 6, and 8 to achieve all the functionality described herein. It should be appreciated that the configuration of logic element 208a may be recreated for each logic element of the logic array block and for multiple logic array blocks of the PLD. Thus, through the embodiments, a user can define whether the LUTs of a logic element are used as a memory element or as combinational logic devices, thereby removing previous restrictions on the ratio of memory and logic. This added flexibility is available through the addition of a write address decoder and modification of a configuration of the programmable logic device.

It should be appreciated that the embodiments described above provide an innovative memory addressing scheme for building a lookup table based memory with no extra cost of interconnect on top of an existing logic array block. All signals that support this configurable memory need no additional routes from the interconnect. Instead of building two sets of address decoders as shown in a typical simple dual port memory, only a write port address decoder is needed. It should be noted that there is no cost on the read port address decoder because of the read address decoder is using the same multiplexors and drivers as used for the data path of the lookup table function. Although the write address decoder is added, the write address decoder is modularly built by simple circuitry and distributed to every logic element in order to gain layout efficiency and allow all of its output signals to be shared by every memory array in different logic elements. The write decoder is a complimentary metal oxide semiconductor logic that decodes write addresses to store data into the lookup table. One skilled in the art will readily appreciate and understand the circuitry for the write address decoder.

The embodiments, thus far, were described with respect to PLDs. The method and apparatus for in-system programmability, described herein may be incorporated into any suitable circuit. For example, the method and apparatus may be incorporated into other types of devices such as a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions.

For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be the STRATIX® II GX devices owned by the assignee.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for selectively configuring a look-up table, comprising;
   providing a write address decoder for each logic element within a logic array block;
   interconnecting each logic element of the logic array block through a write bus providing column select and row select signals from the corresponding write address decoder;
   selecting to operate the look up table as one of a combinational logic device or a memory element based on values of first and second selects signals; and
   reading data from the look-up table based on the value of the first select signal.

2. The method of claim 1, wherein the values are generated from a configuration.

3. A method for selectively configuring a look-up table, comprising;
   providing a write address decoder for each logic element within a logic array block;
   interconnecting each logic element of the logic array block through a write bus providing column select and row select signals from the corresponding write address decoder;
   selecting to operate the look up table as one of a combinational logic device or a memory element based on values of first and second selects signals; and
   multiplexing a data input into the look-up table based on a value of the first select signal.

4. The method of claim 1, further comprising:
   selecting a single bit from one of the look-up table or another look-up table as an output when operating the look-up table as the memory element.

5. The method of claim 1, wherein multiplexers and drivers of the look-up table are shared for use as a read address decoder.

6. The method of claim 1, further comprising:
   selecting a single bit from the look-up table and another single bit from another look-up table as an output when operating the look-up table as the memory element.

7. The method of claim 1, wherein the interconnecting comprises:
   distributing output of the write address decoder among multiple remaining logic elements of the logic array block.

8. The method of claim 1, further comprising:
   reassigning an order associated with write addresses from the write address decoder based on a distance to the write address decoder.

9. An integrated circuit device having selectable memory elements, comprising;
   a logic array block (LAB) disposed within the device, the LAB including,
      a plurality of logic elements, the plurality of logic elements having look-up tables functioning as the selectable memory elements;
      a data path that shares multiplexers and drivers when the look-up tables of the logic elements are operated as one of a memory element or a combinational logic device, wherein read decoding circuitry utilized when the logic elements are operated as a memory element controls data input when the logic elements are operated as a combinational logic device; and
      a write address decoder included within each of the plurality of logic elements and interconnected with the plurality of logic elements.

10. The device of claim 9, wherein the look-up tables are operated as memory elements based on a configuration bit stream of the device.

11. The device of claim 10, wherein an output of the memory elements has one of a two bit data width or a single bit data width.

12. The device of claim 9, wherein a number of input signals to each of the logic elements remains constant whether operating the look-up tables as one of the memory element or the combinational logic device.

13. An integrated circuit device having selectable memory elements, comprising:
   a logic array block (LAB) disposed within the device, the LAB including,
      a plurality of logic elements, the plurality of logic elements having look-up tables functioning as the selectable memory elements;
      a data path that shares multiplexers and drivers when the look-up tables of the logic elements are operated as one of a memory element or a combinational logic device:
   a first multiplexer multiplexing in a data value for use when operating the look-up tables as the memory element; and
   a write address decoder included within each of the plurality of logic elements and interconnected with the plurality of logic elements.

14. The device of claim 13, further comprising:
a second multiplexer configured to provide a read address when operating the look-up tables as the memory element, wherein the first multiplexer and the second multiplexer share a select signal.

15. The device of claim 14, further comprising:
a single output multiplexer receiving output from two look-up tables, the single output multiplexer receiving output of the second multiplexer as a select signal.

16. The device of claim 9, further comprising:
output multiplexers receiving output from corresponding look-up tables, wherein each of the output multiplexers receives respective select signals from output of corresponding multiplexers.

17. The device of claim 16, wherein the output multiplexers are cross coupled with regard to respective inputs.

18. The device of claim 9, wherein the device comprises a programmable logic device (PLD).

19. A logic element, comprising:
a first and second look-up table, the first and the second look-up table selectively functioning as one of a combinational logic device or a memory element based on bit values of a configuration bit stream;
a write address decoder module dedicated to the logic element, the write address decoder module in communication with the first and the second look-up table through a bit line control module of the logic element, and
read address decoding circuitry including a first multiplexer outputting a select signal to a second multiplexer, wherein the read address decoding circuitry controls data input to the first and second look-up table when functioning as the combinational logic device.

20. The logic element of claim 19, wherein the write address decoder module receives input from a write address line and provides output to a column and row select line that is in communication with the bit line control module.

21. The logic element of claim 19, wherein the second multiplexer receives output from the first look-up table.

22. The logic element of claim 21, wherein the
first multiplexer receives having one of the bit values as a select signal.

23. A logic element, comprising:
a first and second look-up table, the first and the second look-up table selectively functioning as one of a combinational logic device or a memory element based on bit values of a configuration bit stream,
a write address decoder module dedicated to the logic element, the write address decoder module in communication with the first and the second look-up table through a bit line control module of the logic element; and
read address decoding circuitry including a multiplexer having one of the bit values as a select signal, wherein the one of the bit values is shared with another multiplexer providing a data input path into the logic element.

24. The logic element of claim 22, wherein the second multiplexer receives one of the bit values from the configuration bit stream as a select signal.

* * * * *